United States Patent [19]

Gisoni et al.

[11] Patent Number: 4,875,043

[45] Date of Patent: Oct. 17, 1989

[54] BI-DIRECTIONAL KEYBOARD INTERFACE CIRCUIT

[75] Inventors: Gregory A. Gisoni, Murrysville; James M. Forker, Monroeville, both of Pa.

[73] Assignee: Westinghouse Electric Corp., Pittsburgh, Pa.

[21] Appl. No.: 154,430

[22] Filed: Feb. 8, 1988

Related U.S. Application Data

[63] Continuation of Ser. No. 814,214, Dec. 23, 1985, abandoned.

[51] Int. Cl.⁴ ............................................. H03M 11/00
[52] U.S. Cl. .................................. 341/22; 340/815.13; 340/815.14
[58] Field of Search ............... 340/718, 815.12, 815.13, 340/815.14, 365 P, 365 S, 365 R; 364/188, 146

[56] References Cited

U.S. PATENT DOCUMENTS

| | | | |
|---|---|---|---|
| 4,278,966 | 7/1981 | Hemsher | 340/815.12 |
| 4,313,109 | 1/1982 | Funk et al. | 340/365 P |
| 4,454,596 | 6/1984 | Wunsuh et al. | |
| 4,459,581 | 7/1984 | Wilson et al. | 340/365 S |
| 4,679,135 | 7/1987 | Kobayashi et al. | 340/188 |

*Primary Examiner*—Donald J. Yusko
*Assistant Examiner*—Tyrone Queen
*Attorney, Agent, or Firm*—D. C. Abeles

[57] ABSTRACT

The present invention includes a keyboard encoder which encodes a key selected by an operator. The encoder is isolated from a bi-directional bus by an isolation circuit. When a key has been selected a key code is made available for reading by a separate CPU. The separate CPU enables transfer of the key code from the encoder to the bi-directional bus and then reads the key code. The separate CPU acknowledges receipt of the key code and provides feedback to keyboard operator by sending a bank and light selection code to the keyboard over the bi-directional interface bus, after the isolation circuit has been reactivated and after a function, to be performed by the separate CPU and specified by the key code, has been started. The isolation circuit prevents the key code and the bank and light selection code from becoming intermixed on the bi-directional bus. The bank select code is used to select a bank of light code decoders which activate a light corresponding to the light code. The light activated stays lit until another key is selected. The transmission of a second bank and light selection code after a single key is selected can be used to activate an additional light associated with the selected key.

12 Claims, 7 Drawing Sheets

| KEY CODE | BANK/LIGHT CODE | KEY CODE | BANK/LIGHT CODE |
|---|---|---|---|
| 00 | 7F | 10 | BF |
| 01 | 7E | 11 | BE |
| 02 | 7D | 12 | BD |
| 03 | 7C | 13 | BC |
| 04 | 7B | 14 | BB |
| 05 | 7A | 15 | BA |
| 06 | 79 | 16 | B9 |
| 07 | 78 | 17 | B8 |
| 08 | 77 | 18 | B7 |
| 09 | 76 | 19 | B6 |
| 0A | 75 | 1A | B5 |
| 0B | 74 | 1B | B4 |
| 0C | 73 | 1C | B3 |
| 0D | 72 | 1D | B2 |
| 0E | 71 | 1E | B1 |
| 0F | 70 | 1F | B0 |

↖900

BI-DIRECTIONAL KEYBOARD INTERFACE CIRCUIT

This application is a continuation of application Ser. No. 814,214, filed Dec. 23, 1985 now abandoned.

BACKGROUND OF THE INVENTION

1. Field of the Invention

The present invention is a keyboard interface circuit with a bi-directional bus connectable to a separate central processing unit (CPU) and, more particularly, the present invention is directed to a keyboard which multiplexes a key code to a CPU and light codes from the CPU over the same bi-directional bus to provide feedback to a keyboard operator concerning key selection.

2. Description of the Related Art

In many applications, particularly in the field of nuclear power plant control, it is necessary to backlight keys which have been selected and which correspond to particular dedicated displays. The keys are backlit to provide feedback to the operator that indicates that the proper display is being displayed.

Prior art keyboards as described above are of one of two types where each type has a set of read lines for the separate CPU to read key selections and a set of write lines for the separate CPU to light the corresponding light.

The first type has the same number of read lines as keys and the same number of write lines as lights. That is, if the keyboard has 64 keys and 64 lights, the interface bus includes 128 lines. Many computers, particularly computers connected to other devices besides the keyboard, do not have sufficient input/output lines to dedicate a line for each key and a corresponding line for each light.

In an attempt to reduce the number of lines, many keyboard manufacturers are installing dedicated keyboard computers in the keyboard connected to the keys and lights and to the separate CPU. The keyboard computer transfers key codes over a read bus to the separate CPU and the separate CPU transfers the corresponding light codes back to the keyboard CPU over a write bus. If the keyboard includes 64 keys and 64 lights a read bus with at least 6 lines and a write bus with at least 6 lines is necessary. This configuration reduces the number of read and write lines from 128 to 12, however, the complexity and cost of the keyboard rises due to the addition of the keyboard computer and the necessary software for controlling same.

SUMMARY OF THE INVENTION

It is an object of the present invention to provide a keyboard with a reduced number of interface lines connected to a separate CPU.

It is another object of the present invention to provide a keyboard that does not require a keyboard computer yet has a reduced number of bus lines.

It is an additional object of the present invention to provide a bi-directional interface bus between the keyboard and the separate CPU.

It is a further object of the present invention to provide feedback to the operator as to which key has been depressed.

It is still another object of the present invention to provide the capability of lighting more than one light for each key depressed.

It is a still further object of the present invention to provide a low-cost keyboard which is simple in construction.

To obtain the above-mentioned objects, the present invention includes a keyboard encoder isolated from a bi-directional bus by an isolation circuit. When a selected key is encoded a key code is made available for reading by a separate CPU. The separate CPU acknowledge receipt of the key code by sending a light code to the keyboard over the bi-directional interface bus after a function specified by the key code has been started. The isolation circuit prevents the key code and the light code from becoming intermixed on the bi-directional bus. The light code is used to select a bank of light code decoders which activate a light corresponding to the light code. The activated light remains lit until another key is selected.

These together with other objects and advantages which will be subsequently apparent, reside in the details of construction and operation as more fully hereinafter described and claimed, reference being made to the accompanying drawings forming a part hereof, wherein like numerals refer to like parts throughout.

DESCRIPTION OF THE PREFERRED EMBODIMENT

Figure 1:
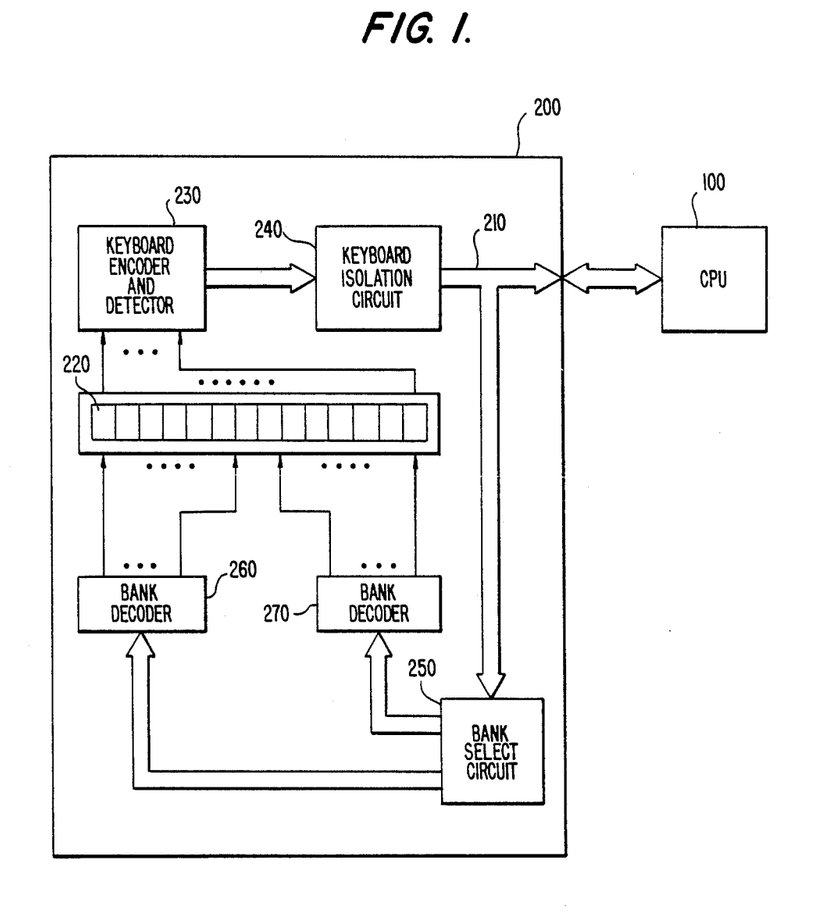
FIG. 1 illustrates an embodiment of the present invention.

A separate central processing unit (CPU) 100, such as an Intel 86/05 is connected to a keyboard 200, according to the present invention over a bi-directional bus 210 having one set of bi-directional lines where all lines are bi-directional as illustrated in FIG. 1, using a bi-directional digital input/output port in the CPU. When a key 220 on the keyboard 200 is depressed, a keyboard encoder and key depression detector 230 produce a key code which is applied to a keyboard isolation circuit 240. When the CPU 100 scans the keyboard 200, the keyboard isolation circuit 240 transfers the key code to the CPU 100 over the bi-directional bus 210. The CPU 100, after starting the function associated with the key code, activates the keyboard isolation circuit 240 to remove the key code from the bi-directional bus 210 and then transfers a light code, including a bank selection code, over the bi-directional bus 210. A bank select circuit 250 transfers the light code to one of the bank decoders 260 and 270 in dependence on the bank selection code. The selected bank decoder 260 or 270 decodes the light code and activates a light behind the key 220 which was depressed. In this manner, the operator sees a lit key 220 corresponding to the key depressed after the CPU 100 has started the function associates with the depressed key 220. As a result, the operator receives feedback indicating that the CPU 100 has received the proper key code and started the selected function.

In nuclear power plant control rooms, the function produces a power plant display associated with the key and reproduced on a viewing device such as a plasma display panel. In many such applications, the display may be one of a series of subdisplays indexed from a master display. In this situation, it is desirable to light the key associated with the master display as well as the subdisplay. The provision of at least two bank decoders allows the backlighting of both a master key and a subkey when a subkey is selected thereby providing additional feedback information to the operator concerning which power plant display is active and the relationship of the active display to other inactive displays.

Figure 2:
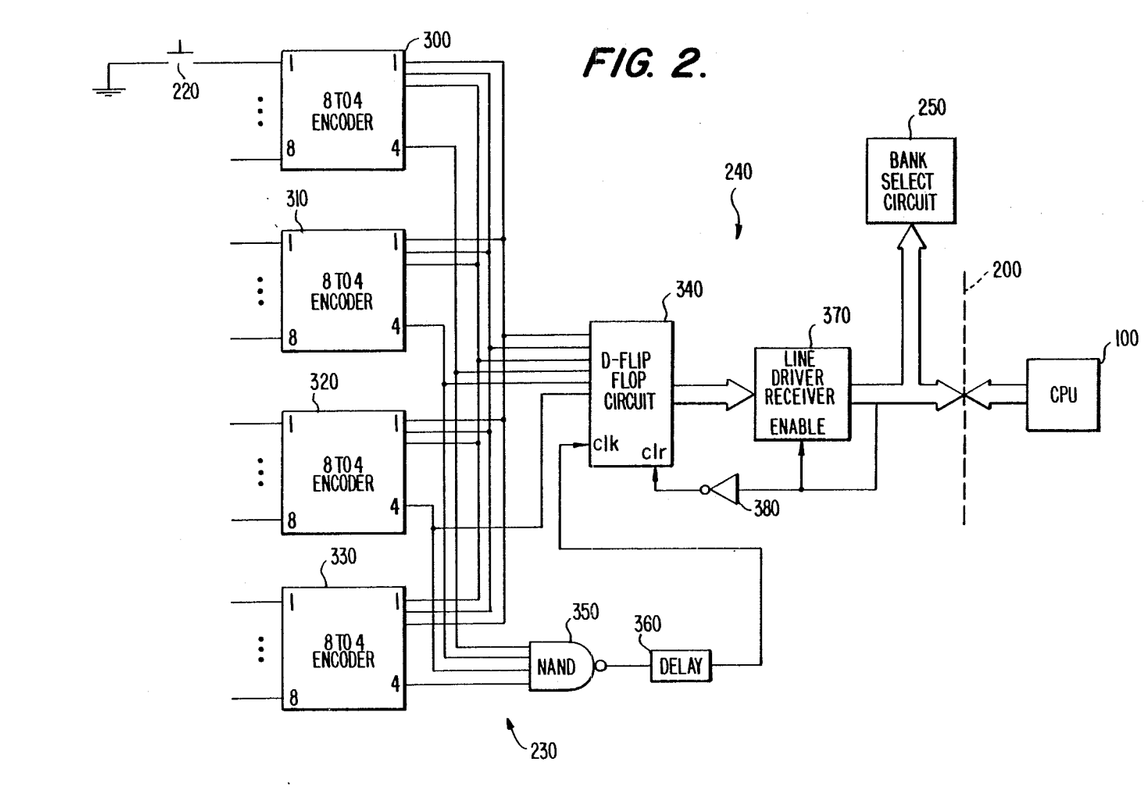
FIG. 2 illustrates the key encoding portion of the keyboard according to the present invention.

When the key 220 is depressed, one of the 8 to 4 encoders 300-330, illustrated in FIG. 2, produces a 4-bit key code associated with the selected key 220. Each of the encoders 300-330 can be a 74LS348 encoder from Texas Instruments. The three low order bits from each of the inputs of the encoders 300-330 are provided to the same D flip-flop circuit 340 which can be a 74LS273 also from Texas Instruments. The high order bit in the encoder corresponding to the selected key is high whenever a key associated with the encoder is selected. Each of the high order bit from the encoders 300-330 is provided to separate inputs of the flip-flop circuit 340 resulting in a 6-bit key code being applied to the flip-flop circuit 340. The separately provided bits allow, the light the encoder as well as the bank producing the 4-bit key code to be identified. The high order bits of all of the encoders 300-330, which indicate which encoder is active, are also applied to a NAND gate circuit 350 such as a 74LS22 from Texas Instruments. When the key selection pulse from one of the encoders 300-330 is provided to the NAND gate 350, it produces a key pulse which is delayed by a delay circuit 360 which can plural 74SO5 inverters from Texas Instruments. The use of a NAND gate 350 ensures that when two keys are selected simultaneously, the error is ignored. The delayed signals, which is delayed for about 29 nanoseconds, acts as a key depression detection pulse and is applied to the clock input of the D flip-flop circuit 340. As a result, the 6-bit key code is transferred (latched) to the output of the flip-flop circuit 340. When the CPU 100 transfers a read enable code over the bi-directional bus 210, a line driver receiver 370, such as a 74LS244 from Texas Instruments, transfers the 6-bit key code to the CPU 100 over the bi-directional bus 210. Later, when the CPU disables the line driver receiver 370 by toggling the enable line low and, as a result, places the outputs of the receiver 370 in a high impedance state, a clear pulse is also applied to D-flip-flop circuit 340 through inverter 380 which can be a 74SO5 from Texas Instruments. The clear pulse clears the output of the D-flip-flop circuit 340 so that if the line driver receiver 370 is accidentally enabled no key code gets placed on the bi-directional bus 210.

Figure 3:
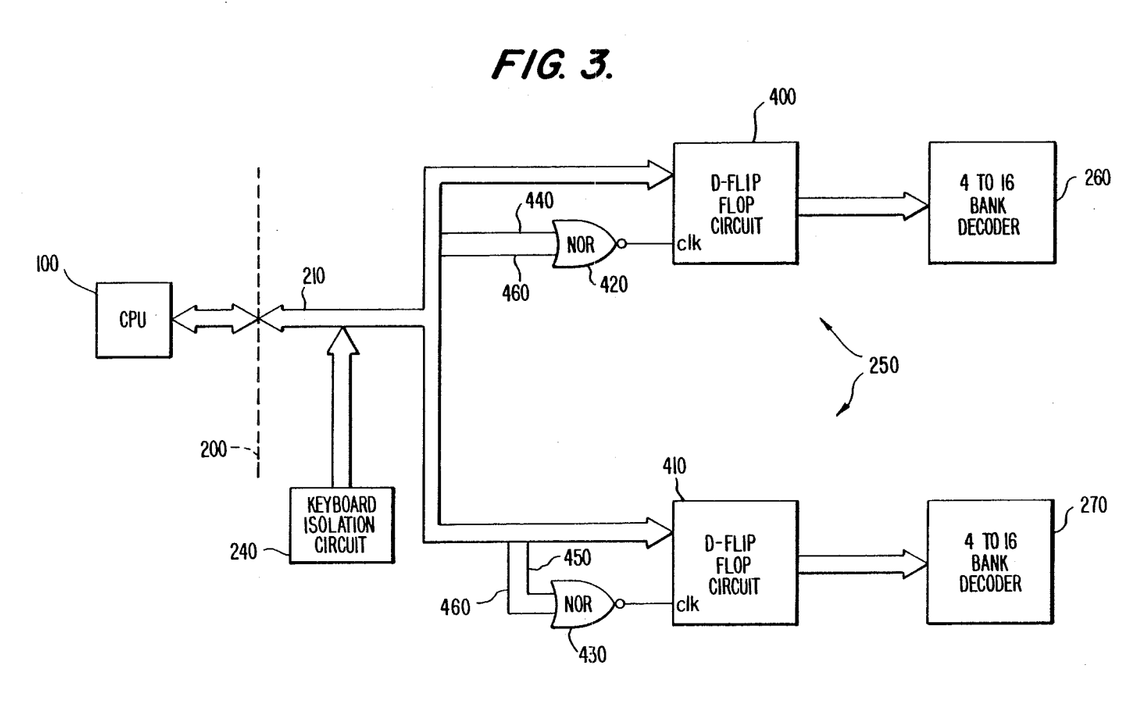
FIG. 3 illustrates part of the light selection portion of the present invention.

Before the CPU 100 transfers the light code over the bi-directional bus, the line driver receiver 370 is disabled thereby activating the keyboard isolation circuit 240 of FIG. 3. In addition, the CPU 100 loads a zero onto the bi-directional bus 210 to ensure that the bus 210 is in a neutral state. When the light code is transferred over the bi-directional bus 210, a bank selection code is transferred therewith. The light code is applied to the D-flip-flop circuits 400 and 410 which can be 74SL378 circuits from Texas Instruments. The one bit of the two bit bank select code is applied to NOR gates 420 and 430, respectively, over bank select lines 440 and 450. When a strobe signal is transmitted over the bi-directional bus 210 and applied to the NOR gates 420 and 430 via a strobe line 460, a clock signal is applied to a clock input of the flip-flop circuit 400 or 410 associated with the selected bank. As a result, the selected D flip-flop 400 or 410 transfers the light code to the appropriate bank decoder 260 or 270. An alternative bank select circuit can be provided which uses only one bank select line if an inverter is connected to the input of one of the NOR gates 420 or 430.

Figure 4:
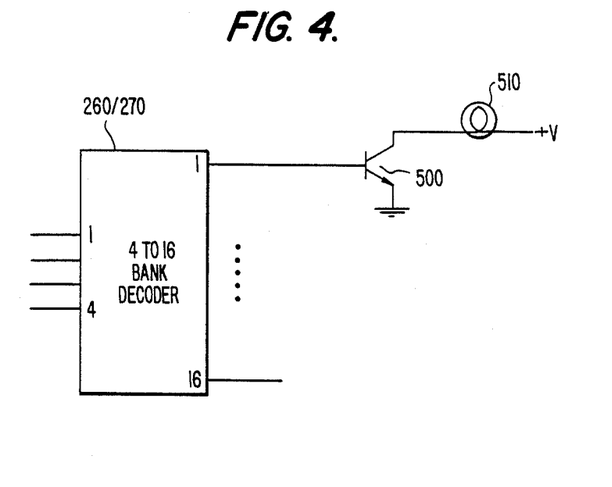
FIG. 4 illustrates the details of a light code decoder and light drive circuit in accordance with the present invention.

Each bank decoder 260/270 can be a 74154 circuit from Texas Instruments. The bank decoder drives a power transistor 500 which activates a key light 510, as illustrated in FIG. 4. The power transistor 500 can be obtained from National Semiconductor and should be capable of handling 177 millilamps.

Figure 5:
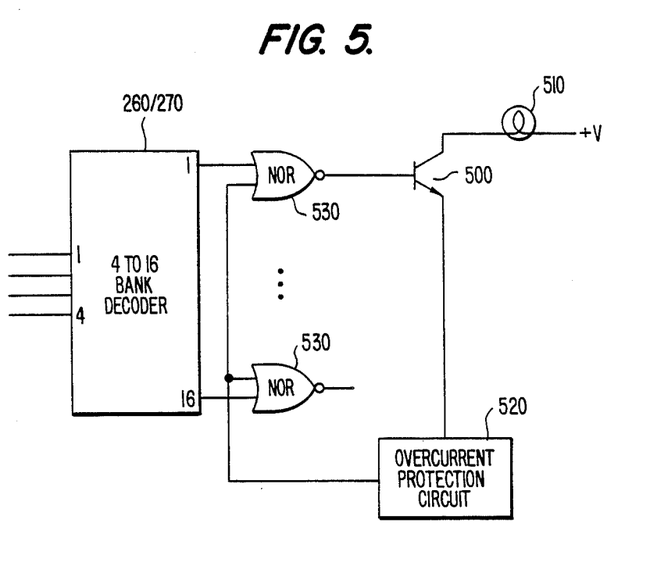
FIG. 5 illustrates the light code decoder and light drive circuit of the present invention with an over protection circuit connected thereto.

An alternate version of the bank decoder and light circuit which provides overcurrent protection is illustrated in FIG. 5. If a short circuit occurs in the light circuit, the short is sensed by overcurrent protection circuit 520 which disables the power transistor 500 through a NOR gate 530, such as a 74LS33 from Texas Instruments. The details of the overcurrent protection circuit can be found in U.S. patent application Ser. No. 728,071, filed Apr. 29, 1985 and assigned to the assignee of the present invention.

As discussed above, the separate CPU 100 enables a read, performs a key code read, converts the key code to a bank and light select code, clears the bus 210, and transfers the bank and light select code over the bus 210 to light the appropriate light.

Figure 6:
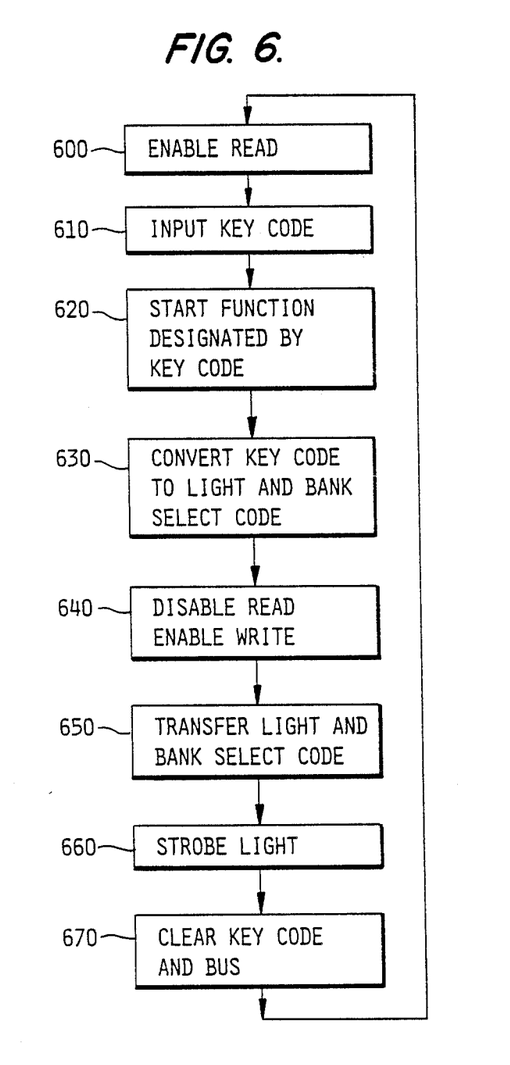
FIG. 6 illustrates a flowchart of a program executed by a CPU separate from the keyboard.

FIG. 6 illustrates the program executed by CPU 100 which reads the key code and produces the bank and light selection code. First, the CPU enables 600 a read by setting the input/output port of the CPU to an input mode and transferring a read enable code over the bus 210 to activate the line driver receiver 370 which, as discussed before, transfers the key code onto the bi-directional bus 210. The key code is then input 610 after which the CPU determines which function should be started corresponding to the key code and starts the same 620. Once the function has been started, the key code is converted 630 into the light and bank selection code. Once the light and bank select code is produced, the CPU disables the read 640, thereby clearing the key code from the flip-flop 340 and removing the key code from the bi-directional bus 210. At the same time the input/output port of the CPU is set to an output mode (Enable Write) allowing the bank and light selection code to be transferred 650 over the bus 210. Once the light and bank selection codes are transferred, after a settling delay, the CPU transfers a strobe pulse 660 over the bi-directional bus which causes NOR gates 420 and 430 to clock one of the flip-flop circuits 400 and 410. As a result, the light code is decoded and the appropriate light is activated. It is possible at this point to transfer another bank and light selection code over the bi-directional bus 210 followed by a strobe pulse to activate more than one light for the selected key. Once the light is lit, the key code and bus are cleared 670, so that any intervening key depressions are disabled thus ensuring that the light associated with the function selected is indeed activated.

Figure 7:
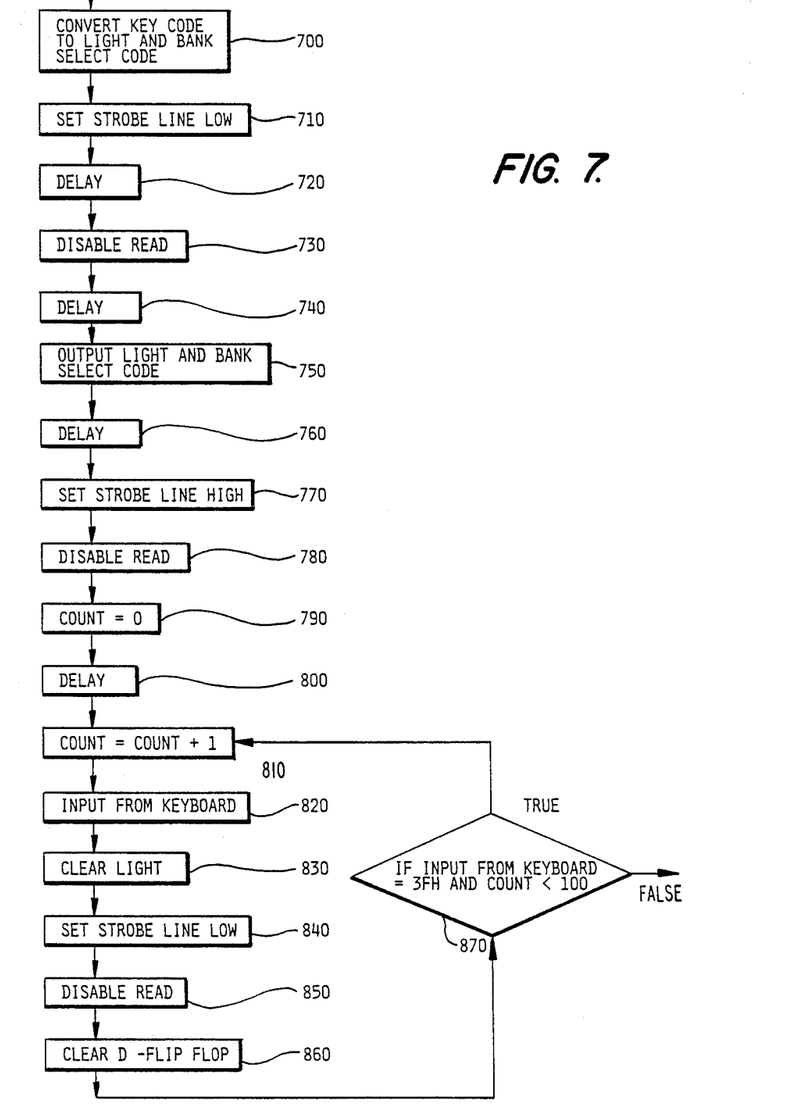
FIG. 7 illustrates the details of a portion of the flowchart in FIG. 6.

FIG. 7 illustrates in greater detail the sequence of events which transfers the bank and light selection code and activates the correct light. After the key code is converted 700 into the bank and light selection code, the strobe light is set 700 low. A settling delay 720 is then provided before the read is disabled 730. Following the disable of the read by activating the isolation circuit, a delay 740 occurs to allow the isolation circuit to function before the bank and light selection code is output 750. Following the output of the code and before the strobe line is set high at 770, a settling delay 760 is also provided. After the strobe line is set high, the corresponding light should be activated and once again the read is disabled 780 to ensure no intermixing of the codes and to clear the key code from the flip-flop circuit 340. A count which is used to help determine whether the bi-directional bus 210 has been cleared is set 790 to 0 followed by a setting delay 800. Next, the count is incremented 810 by 1 and the content of the bi-directional bus 210 is read 810 to determine if the bus 210 is in a neutral state. The CPU then outputs 830 a clear light code to ensure that the bus is neutral, sets the strobe line low 840 and disables the read 850 to clear the flip-flop 860. If the input from the keyboard is not equal to a certain value indicating a clear or neutral state bi-directional bus 210 and the count (the number of times an attempt to clear the bus has been made) is less than 100, the sequence of events which attempt to clear the bus are tried again 870. When the bus is clear, the program returns to the beginning of the scan program 600, as illustrated in FIG. 6.

Figure 8:
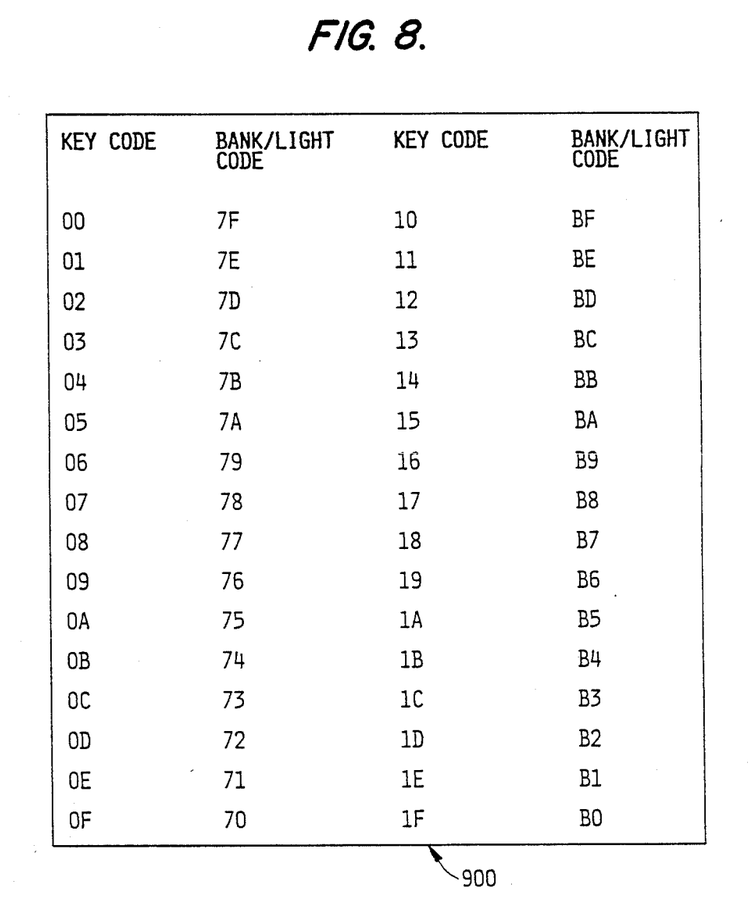
FIG. 8 provides an example of a key code to light code conversion table.

FIG. 8 illustrates an example of a key code to bank and light selection code conversion table 900 maintained in CPU 100. The key code is used to access the table 900 to retrieve the associated bank and light selection code. The first digit of both the key and bank and light selection code indicates the bank and the second digit indicates the key or the light to be activated.

The present invention requires that the separate CPU 100 actually scan the keyboard at periodic intervals of at least one second to obtain the key code. It is possible, however, to arrange the keyboard so that it provides an interrupt signal to the CPU 100. Such an interrupt signal can be provided by connecting a 1-shot monostable gas circuit, between the NAND gate 350 (FIG. 2), and the clock input of the D flip-flop circuit 340 and making the output of the additional 1-shot circuit part of the bi-directional bus 210. This 1-shot circuit, which could be a 74LS221 from Texas Instruments, would provide the necessary delayed interrupt signal over the bi-directional bus 210. It is also possible to provide a single bank of lights and keys thus eliminating the need for the bank select circuit 250. It is further possible to have more than two banks of lights and keys and to have plural lights activated in association with each key depressed as long as the lights associated with the depressed key are activated in different banks. It is possible to activate the light associated with the key whenever a key is depressed without requiring feedback from the CPU 100 by connecting the enable input of the line driver receiver 370 to the NOR gates 420 and 430 and the bank select circuit thereby causing the key code on the bi-directional bus 210 to be decoded immediately as the bank and light selection code to activate the associated light. This modification, however, removes the feedback necessary in an operation such as a nuclear power plant control room and thus would not be suitable for situations where feedback is necessary.

The many features and advantages of the invention are apparent from the detailed specification and, thus, it is intended by the appended claims to cover all such features and advantages of the circuit which fall within the true spirit and scope of the invention. Further, since numerous modifications and changes will readily occur to those skilled in the art, it is not desired to limit the invention to the exact construction and operation illustrated and described, and accordingly, all suitable modifications and equivalents may be resorted to within the scope of the invention.

What is claimed is:

1. A keyboard and interface circuit connectable to a computer, said circuit comprising:
   a keyboard having keys and lights corresponding to the keys;
   encoder and detection means for detecting key selection and producing a key code corresponding to a selected key;
   a parallel bi-directional interface bus, having one set of bi-directional lines where all lines are bi-directional, for both transferring the key code to the computer and transferring a first light selection code corresponding to the key code from the computer;
   isolation means for isolating said encoder and detection means from said bi-directional bus; and
   decoder means for decoding the first light code and activating the light corresponding to the selected key.

2. A circuit as recited in claim 1, wherein the first light selection code includes a bank selection code, the lights are arranged in banks and said circuit further comprises bank selection means for selecting a bank in which said decoder means activates the corresponding light.

3. A circuit as recited in claim 2, wherein a second light selection code is transferred over said bidirectional interface bus to said decoder means said decoder means decoding the second light selection code to light a second light associated with the selection key.

4. A circuit as recited in claim 2, wherein said encoder and detection means comprises:
   an encoder operatively connected to the keys and said isolation means, and producing the key code; and
   a NAND gate connected to the encoder and said isolation means, and producing a key depression signal from a portion of the key code.

5. A circuit as recited in claim 2, wherein said isolation means comprises:
   a flip-flop circuit operatively connected to said encoder and detection means; and
   a line driver receiver operatively connected between said flip-flop circuit and said bi-directional interface bus.

6. A circuit as recited in claim 2, wherein said bank selection means comprises:
   a NOR gate operatively connected to said bi-directional interface bus; and
   a flip-flop circuit operatively connected to said bi-directional interface bus said NOR gate and said decoder means.

7. A circuit as recited in claim 2, wherein said decoder means comprises:

a decoder operatively connected to said bank selection means; and a power transistor operatively connected between said decoder and the light associated with the selected key.

8. A keyboard and interface circuit for a computer controlling displays in a light water nuclear reactor control room, said circuit comprising:

a keyboard having keys and lights corresponding to the keys;

an encoder connected to the keys and encoding a selected key to produce a key code;

a NAND gate connected to said encoder and producing a clock signal when a selected key is encoded;

a first flip-flop circuit connected to said encoder and said NAND gate, and outputting the key code when the clock signal is received;

a line driver/receiver connected to said first flip-flop circuit;

a parallel bi-directional interface bus connected to said line driver receiver and connectable to the computer having one set of bi-directional lines for both transferring and receiving data where all lines are bi-directional;

a NOR gate connected to said bi-directional interface bus and decoding a bank selection code;

a second flip-flop circuit connected to said bi-directional interface bus and said NOR gate, and storing a light selection code;

a decoder connected to said second flip-flop circuit and decoding the light selection code; and a power transistor connected between said decoder and the light for the selected key.

9. A circuit as recited in claim 8, further comprising a delay circuit connected between said NAND gate and said first flip-flop circuit, and delaying the clock signal.

10. A circuit as recited in claim 9, wherein said bi-directional interface bus includes a read enable line and said line driver receiver includes an enable input connected to the read enable line, said first flip-flop circuit includes a clear input, and said keyboard and interface circuit further comprises an inverter connected between the read enable line and the clear input.

11. A circuit as recited in claim 10, wherein said bi-directional interface bus includes a bank selection line connected to said NOR gate and said second flip-flop circuit, and a strobe lnie connected to said NOR gate.

12. A keyboard and interface circuit providing operator feed back, said circuit comprising:

a keyboard having keys and lights corresponding to the keys;

encoder and detection means for detecting key selection and producing a key code corresponding to a selected key;

a parallel bi-directional interface bus, having one set of bi-directional lines where all lines are bi-directional, for both transferring the key code and transferring a light selection code corresponding to the key code;

isolation means for isolating said encoder and detection means from said bi-directional bus;

decoder means for decoding the light code and activating the light corresponding to the selected key; and function execution means, connected to said bidirectional interface bus, for executing a function designated by the key code from said bi-directional interface bus and, after starting execution of the function, transmitting the light code over said bi-directional interface bus.

* * * * *